US010541194B2

(12) United States Patent
Holloway et al.

(10) Patent No.: US 10,541,194 B2
(45) Date of Patent: Jan. 21, 2020

(54) SEMICONDUCTOR PACKAGE WITH INTERCONNECTED LEADS

(71) Applicant: Texas Instruments Incorporated, Dallas, TX (US)

(72) Inventors: Jeffrey Gail Holloway, Plano, TX (US); Andy Quang Tran, Grand Prairie, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 15/934,516

(22) Filed: Mar. 23, 2018

(65) Prior Publication Data

US 2018/0277465 A1    Sep. 27, 2018

Related U.S. Application Data

(60) Provisional application No. 62/475,835, filed on Mar. 23, 2017.

(51) Int. Cl.
H01L 23/057    (2006.01)
H01L 23/498    (2006.01)
H01L 23/31    (2006.01)
H01L 23/495    (2006.01)
H01L 21/48    (2006.01)

(52) U.S. Cl.
CPC .... H01L 23/49534 (2013.01); H01L 21/4821 (2013.01); H01L 23/057 (2013.01); H01L 23/3107 (2013.01); H01L 23/4952 (2013.01); H01L 23/49555 (2013.01); H01L 23/49575 (2013.01); H01L 23/49811 (2013.01); H01L 23/49822 (2013.01); H01L 23/49838 (2013.01); H01L 23/49541 (2013.01)

(58) Field of Classification Search
CPC ............... H01L 23/3107; H01L 23/057; H01L 23/49541; H01L 23/49811; H01L 23/49805; H01L 23/49827; H01L 23/49838; H01L 23/49555; H01L 24/06; H01L 21/4821
See application file for complete search history.

(56) References Cited

U.S. PATENT DOCUMENTS 4,989,066 A * 1/1991 Sumi ................. H01L 23/49541
                                                                    257/692
5,270,673 A * 12/1993 Fries ........................ H01P 5/08
                                                                    29/846

(Continued)

Primary Examiner — Marcos D. Pizarro
Assistant Examiner — Antonio B Crite
(74) Attorney, Agent, or Firm — Dawn Jos; Charles A. Brill; Frank D. Cimino

(57) ABSTRACT

A semiconductor package includes a semiconductor die and a ceramic package body covering the semiconductor die. The ceramic package body includes a plurality of contact pads. Each of a first plurality of leads includes a top portion and a bottom portion. The top portion of each of the first plurality of leads is electrically connected to a contact pad of the plurality of contact pads. Each of a second plurality of leads includes a top portion and a bottom portion and an interconnection portion between the top portion and the bottom portion. The top portion of each of the second plurality of leads includes separate finger portions that are electrically connected to at least two of the plurality of contact pads.

17 Claims, 6 Drawing Sheets

(56) References Cited

U.S. PATENT DOCUMENTS

| | | | | |
|---|---|---|---|---|
| 5,331,334 A * | 7/1994 | Murayama | ............ | H01J 29/96 |
| | | | | 313/496 |
| 5,939,781 A | 8/1999 | Lacap | | |
| 2007/0130759 A1 | 6/2007 | Harnden et al. | | |
| 2010/0072862 A1 * | 3/2010 | Berger | ................ | B81B 7/0058 |
| | | | | 310/370 |
| 2016/0284632 A1 * | 9/2016 | Shinohara | .......... | H01L 23/3121 |

* cited by examiner

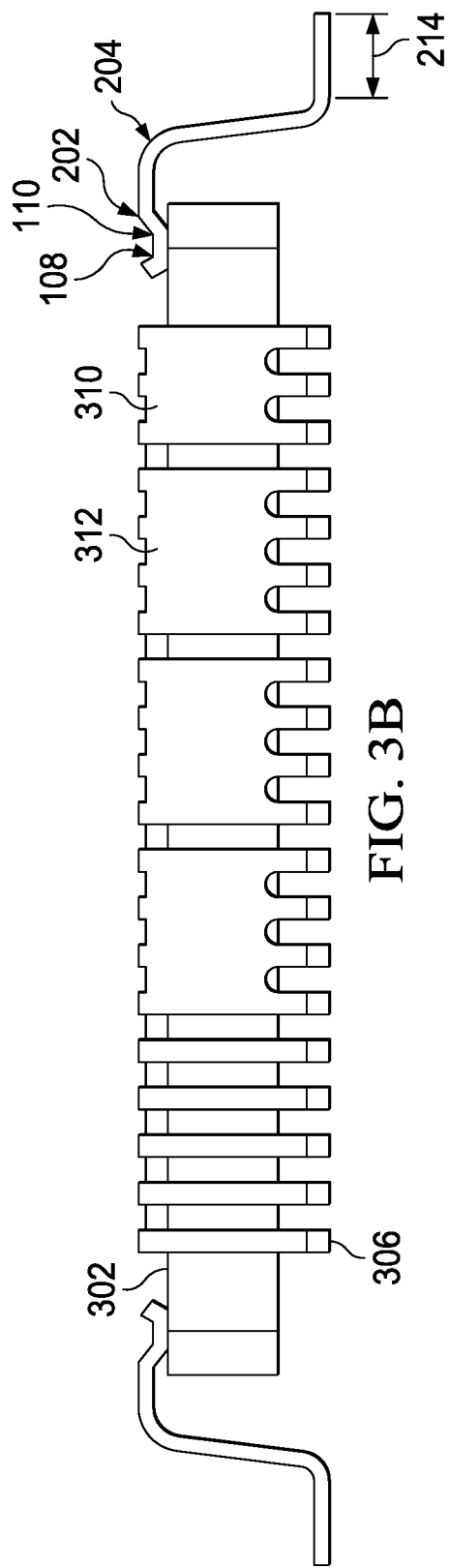

SEMICONDUCTOR PACKAGE WITH INTERCONNECTED LEADS

CROSS REFERENCE TO RELATED APPLICATIONS

This application claims priority from U.S. Provisional Patent Application 62/475,835 filed on Mar. 23, 2017, which is hereby incorporated by reference in its entirety.

TECHNICAL FIELD

The present disclosure relates generally to semiconductor packages, and more particularly to leads of a ceramic package.

BACKGROUND

Semiconductor devices are packaged using a metal, plastic or ceramic package to protect the semiconductor device from impact, corrosion and moisture. Packages also provide a connection means between the semiconductor device inside the package and circuitry outside the package. The package may also dissipate heat generated in the semiconductor device during operation.

Packages include metal connections that electrically connect the semiconductor device to the external world. These connections, known as leads, may be soldered to circuit boards or other external components. Packages that are molded around the semiconductor device, for example plastic packages, additionally provide a mechanical means to hold the leads in place.

If dissipation of heat and sealing of the semiconductor device within the package are critical to the operation of the semiconductor device, a ceramic package may be desired. Packaging materials in the ceramic package provide good thermal conductivity and hermeticity.

Electrical parasitics, or for example inductance and resistance, can degrade the electrical characteristics of the packaged device. Electrical parasitics are an unavoidable and unwanted electrical character that exists between the parts of an electronic component or circuit. For example, when two electrical conductors at different voltages are close together, the electric field between them causes electric charge to be stored on them; this effect is parasitic capacitance. Another example is a resistor designed to possess resistance, but that also has unwanted parasitic capacitance. The leads on a ceramic package substantially contribute to electrical parasitics. Widening the leads reduces the electrical parasitics. However, widening the leads require use of non-standard fabrication, assembly, test methods, and tooling. Widening the leads also causes lateral thermal stresses eventually resulting in lead buckling or failing lead attachments in the package. Another option to reduce electrical parasitics is to increase lead count or dimensions that negatively impact the foot print size of the package. Yet another option to reduce electrical parasitics is to use a fused portion at an entire length of the lead. Such a lead structure requires a broad land on the printed circuit board to which the leads are attached to and a broad braze pad on the package where accumulated stress leads to lead buckling or delamination.

SUMMARY

One aspect provides a semiconductor package. The semiconductor package includes a semiconductor die and a ceramic package body covering the semiconductor die. The ceramic package body includes a plurality of contact pads. Each of a first plurality of leads includes a top portion and a bottom portion. The top portion of each of the first plurality of leads is electrically connected to a contact pad of the plurality of contact pads. Each of a second plurality of leads includes a top portion and a bottom portion and an interconnection portion between the top portion and the bottom portion. The top portion of each of the second plurality of leads includes separate finger portions that are electrically connected to at least two of the plurality of contact pads.

Another aspect provides ceramic semiconductor package. The ceramic semiconductor package includes a semiconductor die and a ceramic package body covering the semiconductor die. The ceramic package body includes a plurality of contact pads. Each of a plurality of leads includes a top portion and a bottom portion. The top portion of each of the plurality of leads is electrically connected to a respective one of the plurality of contact pads. The plurality of leads includes a first lead and a second lead. A top portion of the first lead and a top portion of the second lead extend from an interconnection portion and a bottom portion of the first lead and a bottom portion of the second lead extend from the interconnection portion.

Other aspects and examples are provided in the Drawings and the Detailed Description that follows.

BRIEF DESCRIPTION OF THE VIEWS OF DRAWINGS

For a more complete understanding of the present disclosure, and the advantages thereof, reference is now made to the following descriptions taken in conjunction with the accompanying drawings, in which:

FIG. 3b is a side view of the packaged semiconductor device of FIG. 3a;

DETAILED DESCRIPTION

To reduce electrical parasitics, for example inductance and/or resistance, of the leads to a ceramic package, the disclosed examples include an interconnection portion between top and bottom portions of the leads of a ceramic package forming interconnected leads (or fused leads). This example is used in conjunction with changing the composition of the leads so as to reduce the inductance and/or the resistance of the leads.

Figure 1:
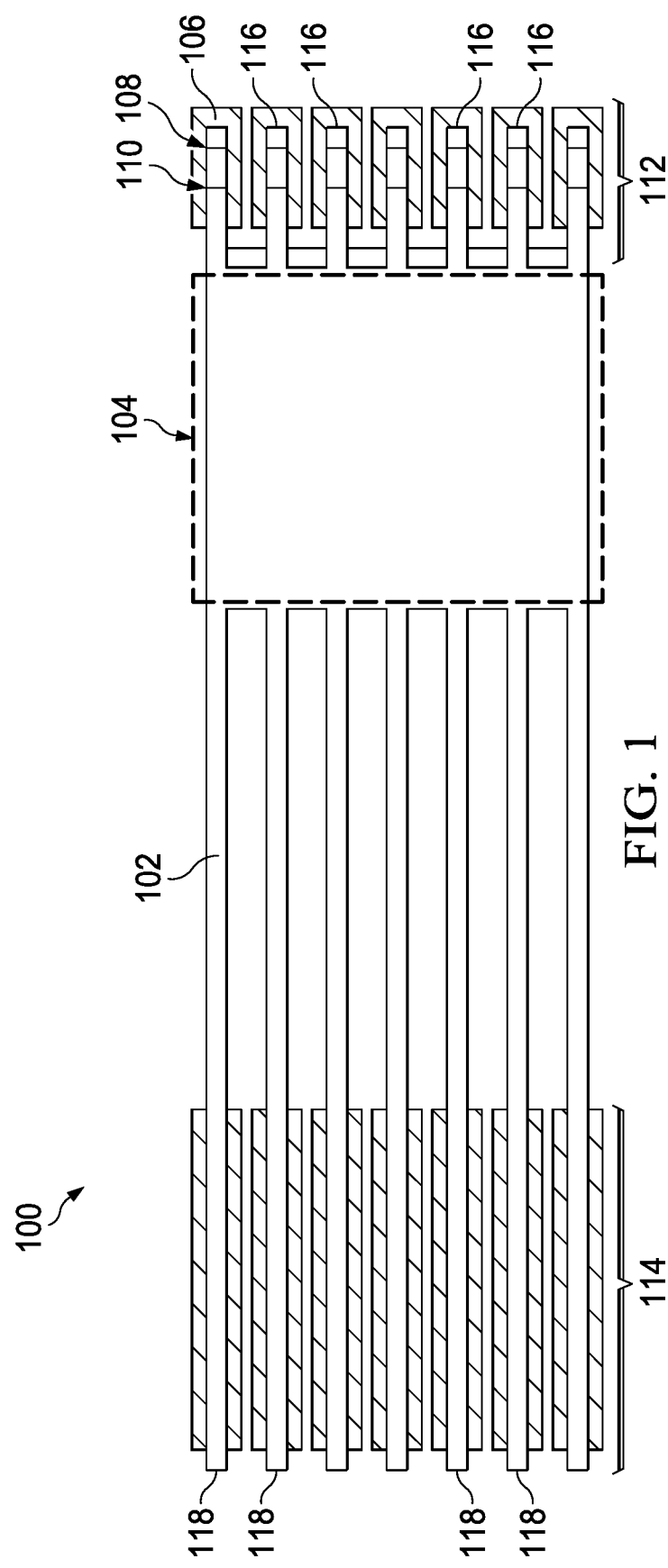
FIG. 1 is a top view of a lead according to an example.
Figure 2:
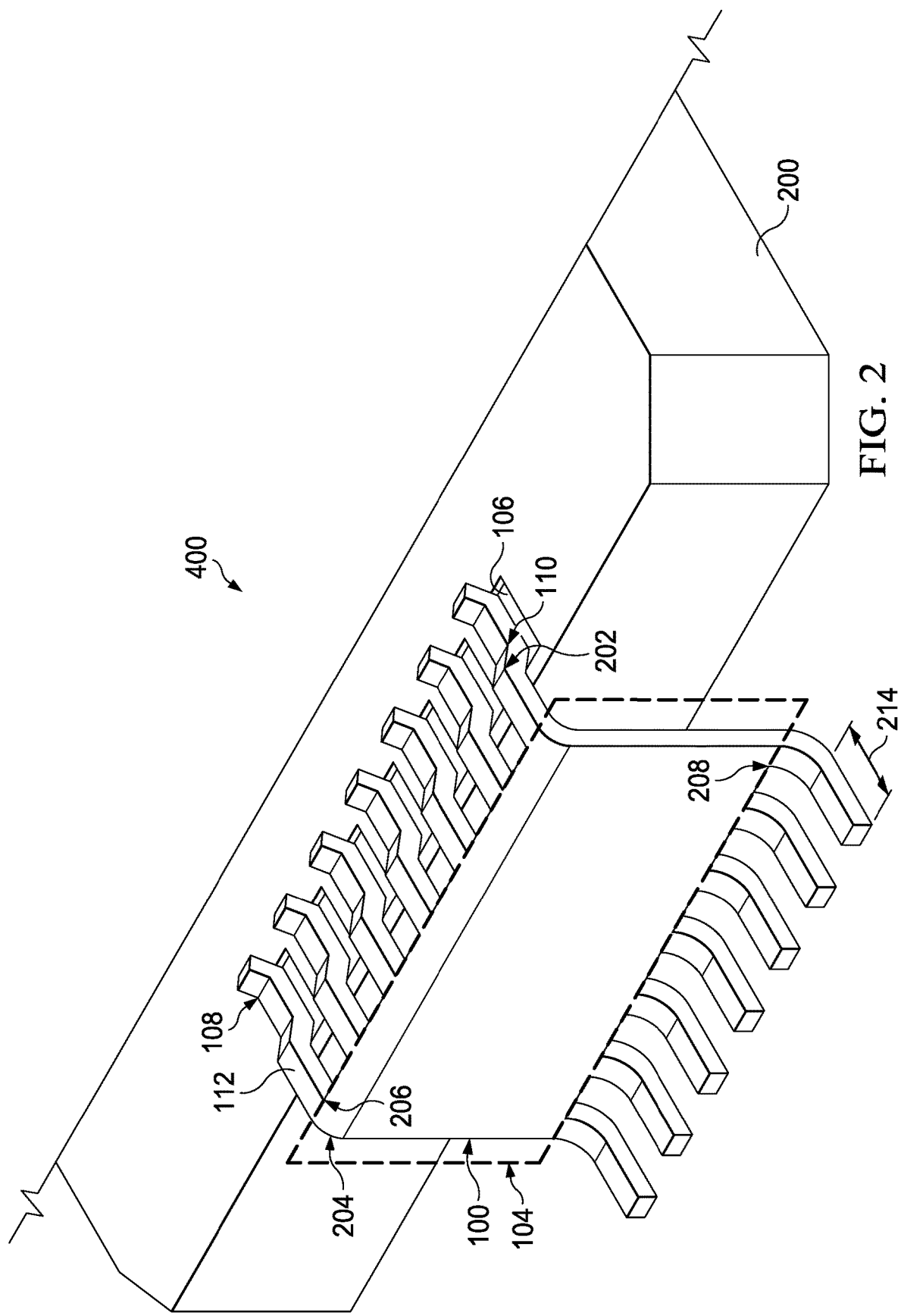
FIG. 2 is a perspective view of a portion of a ceramic package that includes the lead of FIG. 1.
Figure 3A:
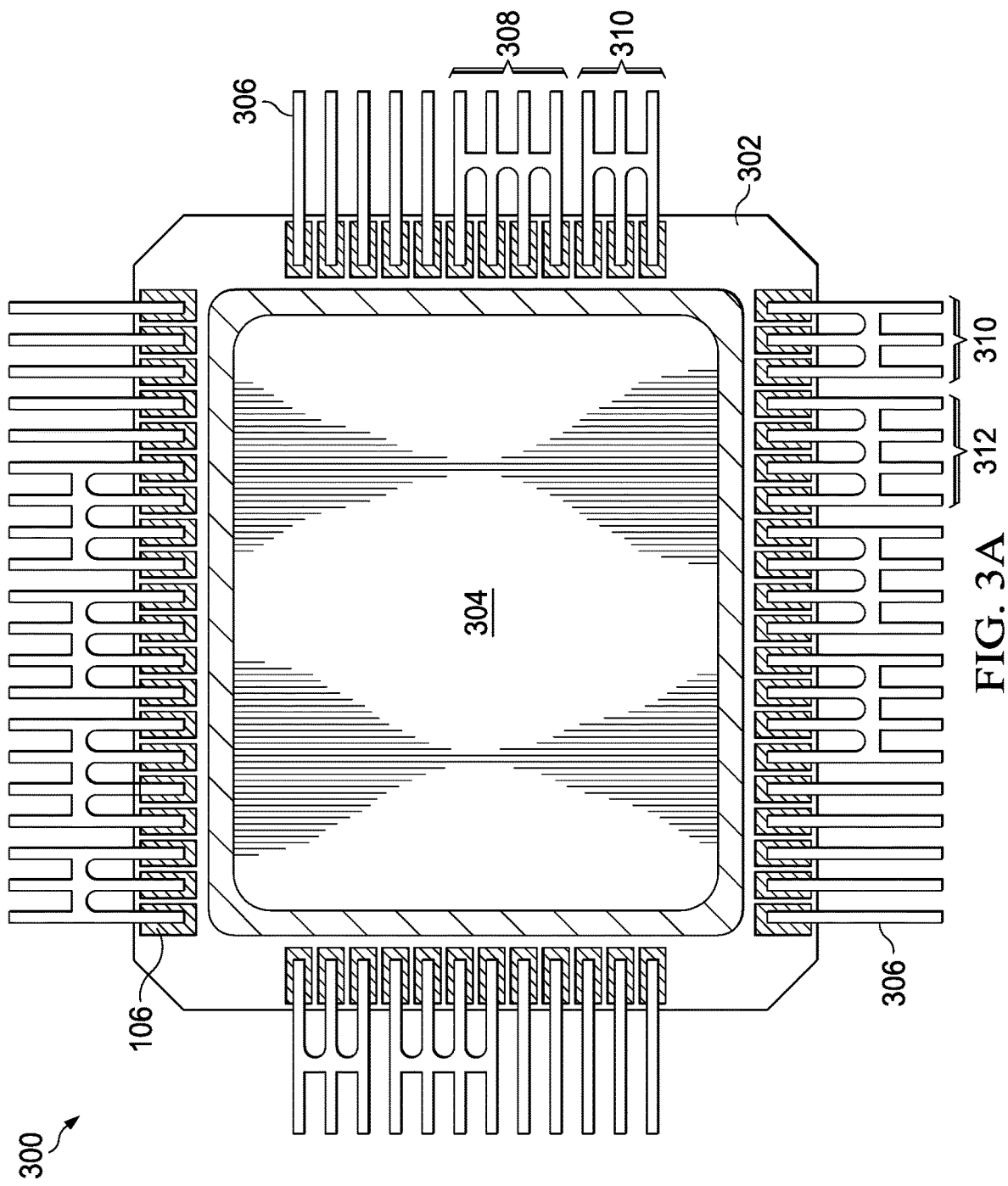
FIG. 3a is a top view of a packaged semiconductor device according to an example.
Figure 4:
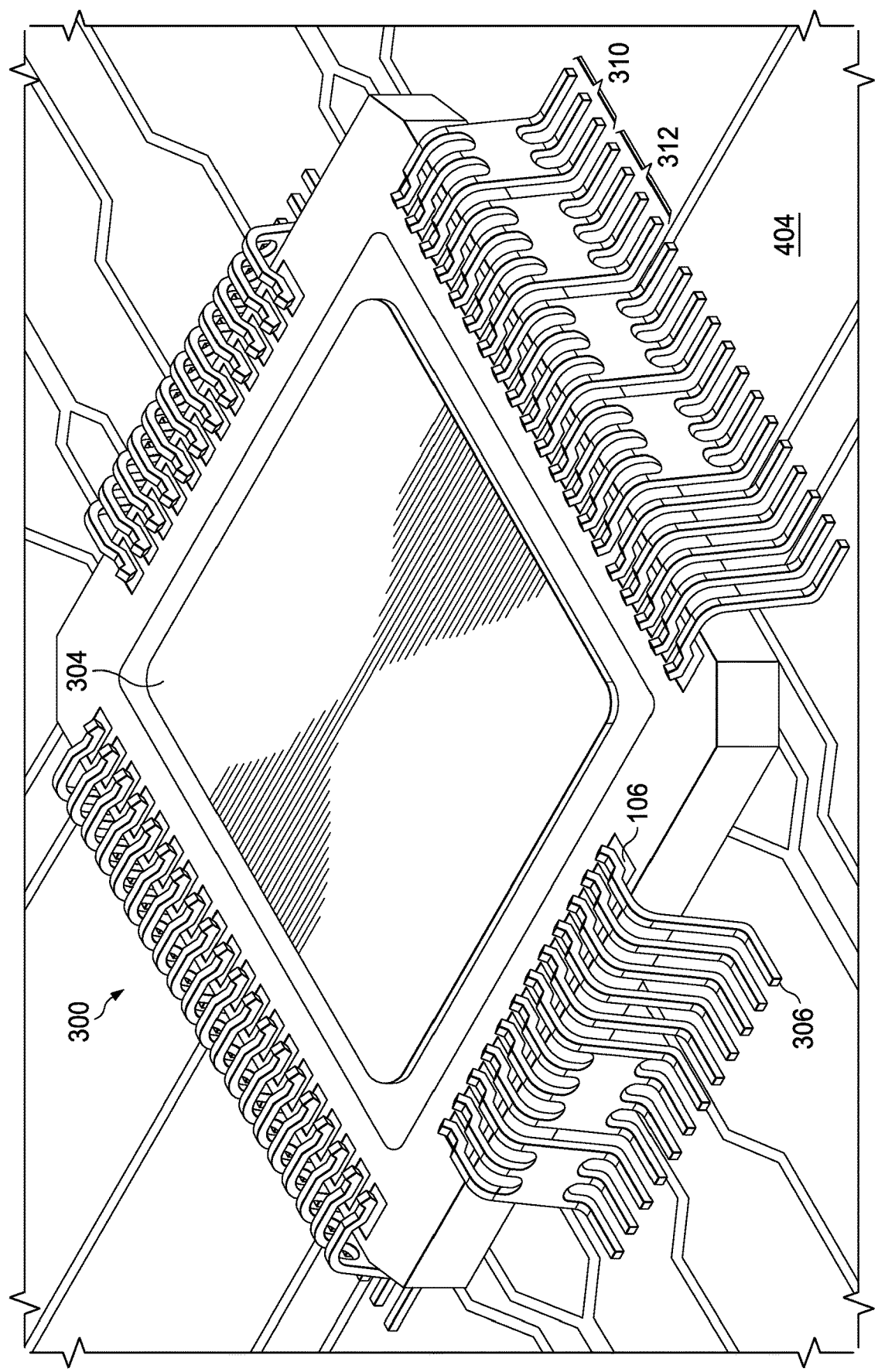
FIG. 4 is a perspective view of a packaged semiconductor device according to an example.
Figure 5:
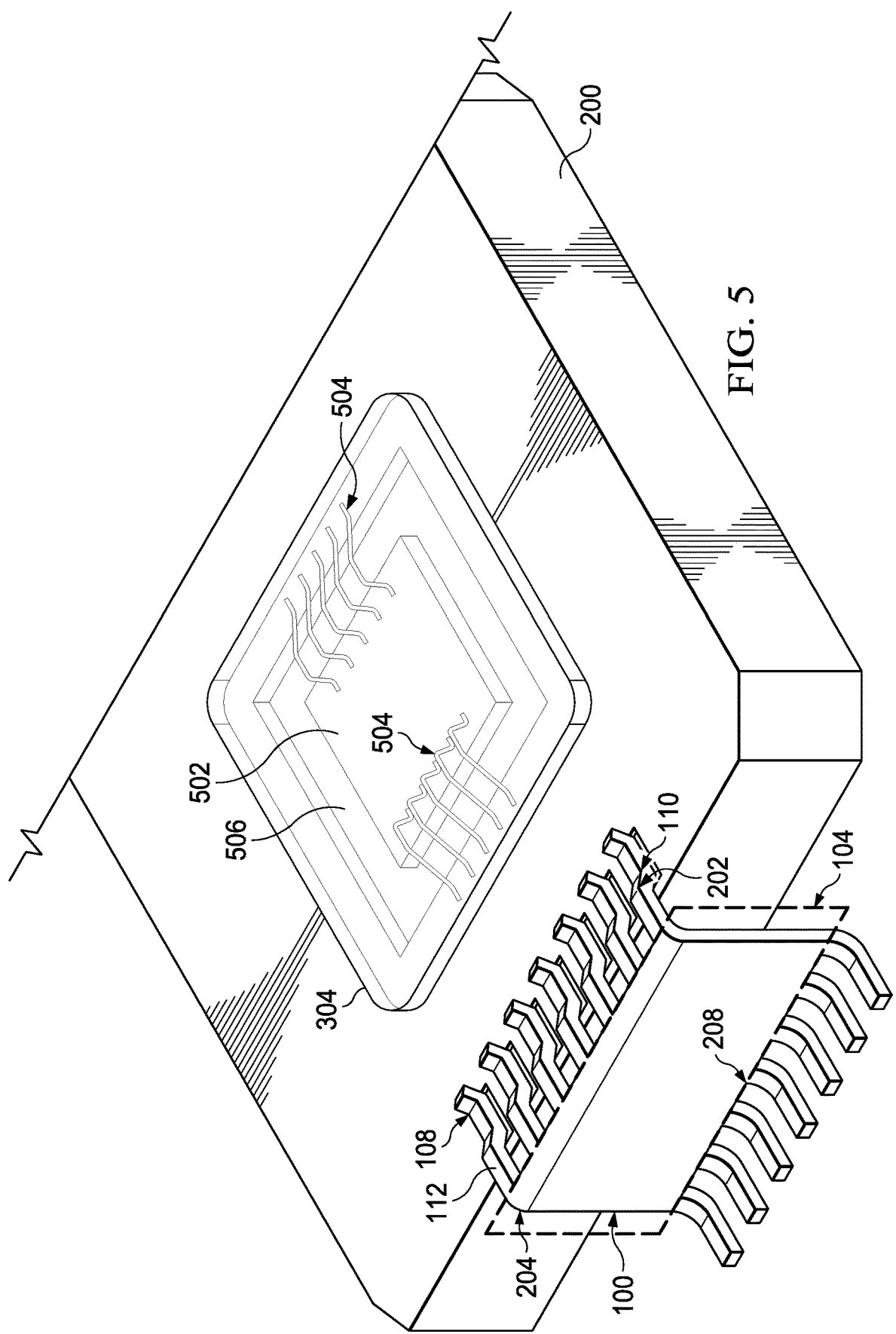
FIG. 5 is a perspective view of a packaged semiconductor device showing a semiconductor die in the package according to an example.

FIG. 1 illustrates an interconnected lead 100 formed according to one example. As shown in FIGS. 3a, 3b and 4, several singular leads (labeled as lead 306 and also referred to as a first plurality of leads) and interconnected leads 100 of this example (including interconnected leads 308, 310, 312 and 320) are used to provide the necessary connections to a semiconductor device. The semiconductor device, for example, is a semiconductor die 502 as shown in FIG. 5. The leads (100, 308, 310, 312 and 320; also referred to as a second plurality of leads) comprised of iron, nickel, cobalt or an alloy of two or three of these metals, copper, copper alloys, aluminum, aluminum alloys, and iron-nickel alloys provide an electrical connection from the contact pads 106 on a ceramic package body (shown in FIG. 2, 200) to an underlying circuit board or a similar structure. The leads (100, 308, 310, 312 and 320) are brazed by reflowing a conductive paste between each lead and its corresponding contact pad 106 on the ceramic package body 200. Unlike plastic packages, where a portion of the leads are encased by the plastic package, the leads for the ceramic package are not secured by encasing a portion of the leads.

Each of the singular leads 306 and the interconnected leads 100 (referred to also as leads 100, 306) includes a top portion 112 and a bottom portion 114. Top portion 112 includes those portions of the leads 100, 306 that are attached to a contact pad 106 of the ceramic package body 200. Bottom portions 114 include those portions of the leads 100, 306 that may be attached to a printed circuit board (shown in FIG. 4, 404). In one example, bottom portions 114 include those portions of the interconnected lead leads 100, 306 that are, for example, attached to the other packaged semiconductor device or other electronic component. The interconnected leads 100 include an interconnection portion 104 that is in between the top 112 and bottom portions 114 of the interconnected leads 100. Interconnection portion 104 and the top 112 and bottom portions 114 are formed as a unitary structure where the interconnection portion 104 electrically and mechanically connects the top 112 and bottom portions 114. Therefore, the interconnection portion 104 and the top 112 and bottom portions 114 are formed of a same material which includes iron, nickel, cobalt and an alloy of two or more of iron, nickel and cobalt. In one example, thickness of the interconnection portion 104 is same as the thickness of the top 112 and bottom portions 114. In another example, thickness of the interconnection portion 104 is different than the thicknesses of the top 112 and bottom portions 114.

The top portion 112 of the interconnected leads 100 includes several separate finger portions 116 that together form the top portion 112. Similarly, the bottom portion 114 of the interconnected leads 100 includes several separate finger portions 118 that together form the bottom portion 114. Separate finger portions 116 are separate extensions from the interconnect portion 104, where each of the separate extensions is connected to one contact pad 106. Separate finger portions 116 are separate extensions from the interconnect portion 104, where each of the separate extensions may be attached to may be attached to a printed circuit board 404. An interconnected lead 100 includes at least two separate finger portions 116 of the top portion 112 and at least two separate finger portions 118 of the bottom portion 114. Interconnected lead 100, as illustrated in FIG. 1, is untrimmed. Prior to using interconnected lead 100 in a semiconductor package, both top and bottom portions 112 and 114 of interconnected lead 100 are bent, providing a surface area to solder or braze to the contact pads 106. Brazing joins two metals by heating and melting a filler material that bonds to the two pieces of metal and joins them. The filler material is an alloy that has a melting temperature below that of the metal pieces that need to be brazed. Brazing can join dissimilar metals such as aluminum, silver, copper, gold, and nickel. Flux is often used during brazing. Bends 108 and 110 are illustrated in FIG. 2.

In one example, the interconnection portion 104 does not extend from the top to the bottom of lead 100. This makes it easier to bend the leads at the top and bottom, as well as solder/braze the leads to the contact pads 106 of the ceramic package body 200. When the interconnection portion 104 does not extend from the top to the bottom of lead 100, the separate finger portions at the top and bottom portion may deform over temperature ranges and reduce the stress at the connection point caused by a mismatch in the coefficient of thermal expansion between the ceramic package body and the interconnected lead 100. Section 112 illustrate areas of interconnected lead 100 where they may be soldered or brazed to underlying contact pad 106. Section 114 illustrates areas of interconnected lead 100 where they may be attached to the printed circuit board 404. In addition, these areas also illustrate where interconnected leads 100 are bent and/or trimmed so as to provide the appropriate connections into and out of the packaged semiconductor device.

In another example, the interconnection portion 104 connects at least two singular leads 306 between the top and bottom portions forming the interconnected lead 100. Stated differently, the interconnection portion is located between the top and bottom portions and those portions 120 of the leads that are connected to the interconnection portion 104 are also part of the interconnection portion 104 as shown in FIG. 1. In yet another example, top portions of a first lead and a second lead (two adjacent leads of the top portion 112) extend from an interconnection portion 104 and a bottom portions of the first lead and second lead (two adjacent leads of bottom portion 114) extend from the interconnection portion 104. An edge of the interconnection portion 104 that connects between, two adjacent leads of the top portion 112 or two adjacent leads of the bottom portion 114, can be either curved or straight edge or a mix of curved and straight edges.

It is important to note that the advantages of the interconnected lead 100 of the disclosure is not readily apparent for traditional plastic encapsulated integrated circuits, because the top portion of the leads used in those packages are encapsulated within the plastic encapsulation. Because of this, the leads in these packages are not soldered or brazed to underlying contact pads on the package.

FIG. 2 depicts how a bent version of interconnected lead 100 is used with a ceramic package body 200. This bent version of interconnected lead 100 is shown and referred to as interconnected lead 400 in FIG. 2. Interconnected lead 400 has two bends (bends 108 and 110) at the top of the lead (shown as top portion 112). This provides a region (between bends 108 and 110) that makes soldering or brazing to the underlying conductive pad 106 of the ceramic package body 200 easier. One of ordinary skill in the art can appreciate that more or less bends are possible than the bends 108 and 110 shown in FIG. 2, and the shape of any bends can be different than those depicted in FIG. 2. An additional bend 204 may be placed closer to or further away from the ceramic package body 200. In one example, bend 204 may not be present. Specifically, if the conductive pads 106 are placed on the side of ceramic package body 200 instead of the top, bend 204 may not be present.

In one example, conductive pads 106 are on the top of the ceramic package body 200 and bend 204 is approximately 90 degrees (including slight variations form 90 degrees due to manufacturing tolerances). As a result of a 90 degree bend 204, interconnected lead 400 runs approximately parallel to or slightly away from the side of ceramic package 200, the amount of bend in bend 204 can range anywhere from 0 to greater than 90 degrees. In the example of FIG. 2, bend 204 occurs around the same location as the beginning of interconnection 104 (depicted by reference numeral 206). However, bend 204 may occur above or below interconnection 104 top 206. The exact location of bend 204 versus region 206 depends on the amount of bending needed, the material used to form interconnected lead 400, the thickness of the interconnected lead 400, the number of separate finger portions 116 in the top portion 112, effects on soldering/brazing and the difficulty in bending lead 400. The same factors are applicable in determining the bottom extent of interconnection 104 (shown reference numeral 208). Section 214 of interconnected lead 400 provides a region to solder/braze to. However, section 214 may be shorter, longer or may bend in the opposite direction (such as toward ceramic package body 200 instead of away from it). For an interconnected lead 400, a plane along section 214 and a plane along the portions of the lead that contact each of the contact pads 106 are approximately parallel to each other.

A portion of each of the leads 100 or 306, which contacts the respective one of the plurality of contact pads, is at a plane different than that of a portion next to the bend. FIG. 2 shows that the portion of the interconnected lead 100 is below and parallel to the finger that is next to the portion labelled 202. The interconnection portion 104, shown in FIG. 2 is approximately parallel to a side of the ceramic package body 200. In other words, a plane along the interconnect portion 104 is approximately parallel to a plane along a side of the ceramic package body 200. The term 'approximately parallel' used herein includes variations in distance between the planes along the interconnect portion 104 and along the side of the ceramic package body 200 that occur due to the tolerances of manufacturing.

The conductive pad 106 is located under and connected to each lead (singular leads 306 or interconnected leads 308, 310, 312 and 320). In addition, each conductive pad 106 is connected to other conductors in/on ceramic package body 200 and/or to the semiconductor device via bond wires or bumps on the semiconductor device. Ceramic package body 200 includes one or more metal layers that provide interconnection to/from the semiconductor device. The ceramic package body 200 also includes a ceramic material selected from alumina, aluminum nitride, or metal oxide. In one example, the ceramic package body 200 includes multiple layers of such ceramic materials. Alternatively, a layer of conductive material is located between one or more of the layers of the multiple layers of ceramic materials and a layer of conductive material is located on the top of the ceramic package body 200. In another example, a layer of conductive material is formed between one or more of the layers of ceramic material and a layer of conductive material is formed on one or more sides along a periphery of the top surface of the ceramic package body 200.

FIG. 3a and FIG. 3b illustrate different views of the semiconductor package according to one example. FIG. 3a is a top view of and FIG. 3b is side view of the ceramic package having a lid 304. FIG. 3a and FIG. 3b include leads that are bent. The ceramic package 300 includes a semiconductor die situated in a cavity in the ceramic package body 302 (semiconductor die 502 is shown in FIG. 5). A lid 304 covers the cavity and seals the semiconductor die in the cavity. The lid is typically metal or ceramic and attached with reflowed solder or glass. Package semiconductor device 300 includes singular leads 306 and interconnected leads 308, 310, 312 and 320. Each side of the ceramic package body 302 has multiple interconnected leads for example 308, 310 and multiple singular leads 306 attached. The interconnected leads 308 and 310 are identical to the interconnected lead 400 in structure and operation, and therefore are not explained again for the sake of simplicity.

Providing interconnect potion 104, in each of these examples, over a portion of the straight length of the lead reduces the parasitics (including inductance and resistance) of these leads because of the additional portions of the meal lead compared to a package with only singular leads. This allows for the use of standard, cost efficient lead attachment (both to the ceramic package body and a circuit board) and standard lead forming equipment. Implementing the interconnected lead 100, 400 also allows for stress relief at the attachment points (see regions 214 and 106).

The interconnected leads 100 or 400 of the disclosure can be used for signal, power and ground connections. FIG. 4 shows another example of the disclosure. In this figure, the ceramic package 304 is connected to an underlying printed circuit board 404. The structure and operation of the ceramic package shown in FIG. 4 is identical to those shown in FIG. 3a, and therefore are not explained again for the sake of simplicity.

FIG. 5 illustrates the ceramic package having a semiconductor die 502. The lid 304 covers the semiconductor die 502 ("die"). The die 502 includes a processor such as a DSP, microprocessor, or microcontroller, an ASIC, a memory device such as a DRAM, SRAM, SDRAM, or EPROM, a digital-to-analog converter, an analog-to-digital converter, a regulator such as a voltage regulator, a voltage converter such as a buck or boost converter, a sensor, a micromechanical device, an amplifier, a transistor, and/or one or more of the above. Each of the semiconductor die is preferably comprised of one or more levels of metal. The metal layers may be copper, aluminum, tungsten, titanium, a combination thereof, or another metal, one or more levels of dielectrics, for example low-k dielectrics, ultra-low k dielectrics, silicon dioxide, or FSG, and/or one or more layers of thereof. While only one semiconductor die is discussed in the description above, one of ordinary skill in the art would appreciate that one or more semiconductor dies may be packaged in a single package. According to one example, the top level of metal of the semiconductor die is electrically connected to the ceramic package using bond wires. According to another example, the semiconductor die is electrically connected to the ceramic package using conductive bumps formed on a pad on a metal layer. The lid 304 is shown as transparent just for illustrative purpose to show the semiconductor die underneath the lid 304. The die 502 is located inside and attached to a cavity 506 in the ceramic package body 200.

The ceramic package body 200 includes multiple layers. These multiple layer includes one or more layers of metal, comprised of sintered particles, formed between layers of ceramic material. These metal layers are patterned to define conductors and contact points such as conductive pads which may connect through conductive vias to other layers in the semiconductor package.

Gold-silicon eutectic or silver filled glass is used to attach the die 502 to a cavity 506. These materials are processed at high temperatures and have good thermal dissipation properties. The Gold-Silicon eutectic requires a wafer back metal to achieve a high reliability die attach. The die 502 is placed onto a gold preform of the die attach material and is heated in a controlled atmosphere. At the elevated process temperatures silicon from the die 502 diffuses into the gold preform forming a liquid material. The liquid material readily wets the wafer backside and the substrate metallization to form the gold-silicon eutectic die attach.

The die 502 is electrically connected to the contact pads 106 using a combination of bond wires 504, a layer of metal and a via (not shown in FIG. 5). One end of each of the bond wires 540 is attached to one bond pad of the die 502. Another end of each of the bond wires 504 s attached to layer of metal that extends into the ceramic. An automated wire bonder machine is used to attach the ends of the bond wires 504. A via (metal filled hole) connects from that layer to the conductive pads 106 to which the singular leads 306 or interconnected leads 308, 310, 312 and 320 are brazed. To form the ceramic package body 200, ceramic tape layers are metallized, laminated and fired to create the package body. The leads (306 or 308, 310, 312 and 320) are then brazed to the ceramic package body 200. The metallized areas of the package are then electroplated (nickel followed by gold). After assembly, the hermetic seal is achieved by soldering a lid 304 onto a metallized and plated seal ring. the lid 12 is coated with a solder border and placed in position over the die 502 and the cavity 506, following which the entire package is subjected to a solder reflow operation. During reflow, the solder border on the lid 304 melts and fuses with a gold-plated border 18 on the ceramic package body 200.

The singular leads 306 or interconnected leads 308, 310, 312 and 320 are initially part of a lead frame strip. In a trim and form process, the individual leads of the lead frame are separated from the lead frame strip. First, the process involves the removal of a dam bar that electrically isolates the singular leads 306 or interconnected leads 308, 310, 312 and 320. Second, the singular leads 306 or interconnected leads 308, 310, 312 and 320 are placed in tooling, cut, and formed mechanically (bent as explained above) to the specified shaped.

The foregoing description sets forth numerous specific details to convey a thorough understanding of the invention. However, it will be apparent to one skilled in the art that the invention may be practiced without these specific details. Well-known features are sometimes not described in detail in order to avoid obscuring the invention. Other variations and example are possible in light of above teachings, and it is thus intended that the scope of invention not be limited by this Detailed Description, but only by the following Claims.

What is claimed is:

1. A semiconductor package comprising:
   a semiconductor die;
   a ceramic package body covering the semiconductor die, the ceramic package body including a plurality of contact pads;
   a first plurality of leads, each of the first plurality of leads including a top portion and a bottom portion, the top portion of each of the first plurality of leads electrically connected to a contact pad of the plurality of contact pads; and
   a second plurality of leads, each of the second plurality of leads including a top portion and a bottom portion and an interconnection portion between the top portion and the bottom portion, the top portion of each of the second plurality of leads including separate finger portions that are each electrically connected to a distinct one of the plurality of contact pads.

2. The semiconductor package of claim 1, wherein:
   each of the contact pads is formed of the conductive material formed on the ceramic package body and each lead of the first plurality of leads and each of the separate finger portions of the second plurality of leads is electrically connected to one contact pad of the plurality of contact pads; and
   the bottom portion of the second plurality of leads includes separate finger portions.

3. The semiconductor package of claim 1, wherein a thickness of the interconnection portion is same as the thickness of each of the first plurality of leads and the top portion and bottom portion of the second plurality of leads.

4. The semiconductor device of claim 1, wherein the top portion of each of the first plurality of leads and the second plurality of leads is brazed onto the respective one of the plurality of contact pads.

5. The semiconductor device of claim 1, wherein the ceramic package body is comprised of a ceramic material selected from the group consisting of alumina, aluminum nitride, and metal oxide.

6. The semiconductor package of claim 1, wherein the semiconductor die includes one or more semiconductor components selected from the group consisting of processor, microcontroller, memory, digital-to-analog converter, analog-to-digital converter, amplifier, regulator, sensor, or MEMs device.

7. The semiconductor package of claim 1, wherein the semiconductor die is electrically connected to each of the plurality of contact pads.

8. The semiconductor package of claim 1, wherein a plane along the interconnect portion is approximately parallel to a plane along a side of the ceramic package body.

9. The semiconductor package of claim 1, wherein the interconnection portion is of the conductive material and is electrically connected to the top portion and the bottom portion.

10. The semiconductor package of claim 9, wherein the first plurality of leads, the second plurality of leads including the interconnection portion are of the conductive material, wherein the conductive material is selected from the group consisting of iron, nickel, cobalt and an alloy of two or more of iron, nickel and cobalt.

11. The semiconductor package of claim 1, wherein each lead of the first plurality of leads and the second plurality of leads include a bend proximate a top surface of the ceramic package body so that each lead extends along a side of the ceramic package body.

12. The semiconductor package of claim 11, wherein each lead of the first plurality of leads and the second plurality of leads includes a portion, which contacts the respective one of the plurality of contact pads, at a plane different than that of a portion next to the bend.

13. A ceramic semiconductor package comprising:
    a semiconductor die;
    a ceramic package body covering the semiconductor die, the ceramic package body including a plurality of contact pads;
    a plurality of leads, each of the plurality of leads including a top portion and a bottom portion, the top portion of each of the plurality of leads electrically connected to a respective one of the plurality of contact pads, the plurality of leads including a first lead and a second lead; and
    an interconnection portion wherein a top portion of the first lead and a top portion of the second lead extend from the interconnection portion and a bottom portion of the first lead and a bottom portion of the second lead extend from the interconnection portion.

14. The ceramic semiconductor package of claim 13, wherein:
    the top portion and the bottom portion of the first and second leads is separated; and
    the interconnection portion fuses each of the first and second leads between the top portion and the bottom portion.

15. The ceramic semiconductor package of claim 13, wherein the bottom portion of each of the plurality of leads is adapted to be attached to a printed circuit board.

16. The ceramic semiconductor package of claim 13, wherein each of the first and second leads is for one of a signal, power, and ground connection.

17. The ceramic semiconductor package of claim 13, wherein a plane along the interconnect portion is approximately parallel to a plane along a side of the ceramic package body.

* * * * *